US012755140B2

(12) United States Patent
Rourk

(10) Patent No.: US 12,755,140 B2
(45) Date of Patent: Oct. 6, 2026

(54) ELECTRON TRANSPORT GATE CIRCUITS AND METHODS OF MANUFACTURE, OPERATION AND USE

(71) Applicant: Christopher J. Rourk, Dallas, TX (US)

(72) Inventor: Christopher J. Rourk, Dallas, TX (US)

( * ) Notice: Subject to any disclaimer, the term of this patent is extended or adjusted under 35 U.S.C. 154(b) by 1232 days.

(21) Appl. No.: 17/061,108

(22) Filed: Oct. 1, 2020

(65) Prior Publication Data

US 2021/0019607 A1 Jan. 21, 2021

Related U.S. Application Data

(63) Continuation of application No. 16/828,384, filed on Mar. 24, 2020, now Pat. No. 10,817,780, which is a continuation-in-part of application No. PCT/US2018/057959, filed on Oct. 29, 2018.

(60) Provisional application No. 62/897,542, filed on Sep. 9, 2019, provisional application No. 62/852,729, filed on May 24, 2019, provisional application No. 62/823,235, filed on Mar. 25, 2019, provisional application No. 62/641,382, filed on Mar. 11, 2018, provisional application No. 62/614,412, filed on Jan.

(Continued)

(51) Int. Cl.

| | |
|---|---|
| ***G06N 3/065*** | (2023.01) |
| ***G06N 3/045*** | (2023.01) |
| ***G06N 3/063*** | (2023.01) |
| ***H10K 10/00*** | (2023.01) |
| ***H10K 10/50*** | (2023.01) |

(52) U.S. Cl.

CPC ............ *G06N 3/065* (2023.01); *G06N 3/045* (2023.01); *G06N 3/063* (2013.01); *H10K 10/50* (2023.02); *H10K 10/701* (2023.02)

(58) Field of Classification Search

CPC ...................................................... B82Y 30/00

See application file for complete search history.

(56) References Cited

U.S. PATENT DOCUMENTS 5,608,231 A 3/1997 Ugajin et al.
5,640,966 A 6/1997 Heden et al.

(Continued)

FOREIGN PATENT DOCUMENTS

DE 102016108017 A1 * 11/2017 ............ C07K 14/00
EP 2883835 6/2015

(Continued)

OTHER PUBLICATIONS

Kolay, et al., "Negative Differential Resistance Behavior of the Iron Storage Protein Ferritin", American Chemical Society, Feb. 7, 2018, 10 pages.

(Continued)

*Primary Examiner* — Shaun M Campbell
(74) *Attorney, Agent, or Firm* — Jackson Walker LLP; Christopher J. Rourk

(57) ABSTRACT

A circuit is disclosed that includes a first electrode, a second electrode and a plurality of quantum dot devices disposed between the first electrode and the second electrode. An impedance is coupled to the second electrode and has a value selected to conduct or block conduction of current when a coherent electron conduction band is formed by one or more of the quantum dot devices, such as with quantum dot devices in an adjacent circuit.

20 Claims, 7 Drawing Sheets

Related U.S. Application Data

6, 2018, provisional application No. 62/590,632, filed on Nov. 26, 2017, provisional application No. 62/584,898, filed on Nov. 12, 2017, provisional application No. 62/581,766, filed on Nov. 5, 2017, provisional application No. 62/578,483, filed on Oct. 29, 2017.

(56) References Cited

U.S. PATENT DOCUMENTS

| | | | | |
|---|---|---|---|---|
| 6,324,532 | B1 | 11/2001 | Spence et al. | |
| 6,489,041 | B2 | 12/2002 | Tamura et al. | |
| 6,627,809 | B1 | 9/2003 | Koga et al. | |
| 6,829,269 | B2 | 12/2004 | Goodhue et al. | |
| 7,026,641 | B2 | 4/2006 | Mohseni et al. | |
| 8,574,685 | B1 | 11/2013 | Lewis et al. | |
| 9,129,221 | B2 | 9/2015 | Piekniewski et al. | |
| 9,187,519 | B1 * | 11/2015 | Slocik | C07K 14/47 |
| 9,287,412 | B2 | 3/2016 | Jain | |
| 9,349,888 | B2 | 5/2016 | Konstantatos et al. | |
| 2004/0028597 | A1 * | 2/2004 | Waiblinger | G11C 13/0014 423/445 B |
| 2004/0262583 | A1 * | 12/2004 | Lee | G02B 6/122 257/E29.082 |
| 2006/0145326 | A1 * | 7/2006 | Tran | H10K 50/11 257/680 |
| 2007/0162263 | A1 | 7/2007 | Forrest | |
| 2010/0257871 | A1 * | 10/2010 | Venkatasubramanian | H01L 23/38 62/3.7 |
| 2010/0290217 | A1 | 11/2010 | Anantram et al. | |
| 2012/0299175 | A1 | 11/2012 | Tran | |
| 2015/0171197 | A1 | 6/2015 | Taylor | H01S 5/309 257/24 |
| 2016/0035772 | A1 | 2/2016 | Yamashita et al. | |
| 2016/0133668 | A1 | 5/2016 | Rothberg et al. | |
| 2016/0161475 | A1 | 6/2016 | Chiu et al. | |
| 2017/0317203 | A1 | 11/2017 | Petta | H01L 31/035236 |
| 2018/0047878 | A1 * | 2/2018 | Glarvey | C09C 3/063 |
| 2019/0058117 | A1 | 2/2019 | Li | H01L 45/145 |

FOREIGN PATENT DOCUMENTS

| | | |
|---|---|---|
| WO | 2011070212 | 6/2011 |
| WO | 2016080911 | 5/2016 |

OTHER PUBLICATIONS

Sala, et al., "Investigation of the Iron(II) Release Mechanism of Human H-Ferritin as a Function of pH", Journal of Chemical Information and Modeling, Aug. 30, 2017, pp. 2112-2118.

Xu, et al., "Electrical Conductivity of Ferritin Proteins by Conductive AFM", American Chemical Society, 2005, 7 pages.

Mehta, et al., "Ferritin accumulation under iron scarcity in *Drosophila* iron cells", Elsevier Masson SAS, 2009, pp. 1331-1334.

Erikson, et al., "Regional Brain Iron, Ferritin and Transferrin Concentrations during Iron Deficiency and Iron Repletion in Developing Rats", American Society of Nutrition, Journal of Nutrition, 127, (1997), (10), pp. 2030-2038.

Choi, et al., "Ferritin-Templated Quantum-Dots for Quantum Logic Gates", Article in Proceedings of SPIE—The International Society for Optical Engineering—May 2005, 21 pages.

Smith, et al., "The Synthesis and Characterization of Ferritin Bio Minerals for Photovoltaic, Nanobattery, and Bio-Nano Propellant Applications", Bringham Young University, BYU Scholars Archive, Jul. 1, 2015, 197 pages.

He, et al., "Ferritin family proteins and their use in bionanotechnology", New Biotechnology, 2015, Dec. 25, 32(6); pp. 651-657.

Bera, et al., "Long-range solid-state electron transport through ferritin multilayers", The Royal Society of Chemistry—Journal of Materials Chemistry, 2019, 11 pages.

Pan, et al., "3D morphology of the human hepatic ferritin mineral core: New evidence for a subunit structure revealed by single particle analysis of HAADF-STEM images", Journal of Structural Biology, 166, 2009, pp. 22-31.

Response to Office Action filed Dec. 22, 2020 in the European Patent Office for co-pending European Patent Application No. 18869562.1, 13 pages.

Gómez, et al., "Transport in random quantum dot superlattices", Journal of Applied Physics, vol. 92, Oct. 15, 2002, pp. 4486-4489.

Lazarenkova, et al., "Miniband formation in a quantum dot crystal", Journal of Applied Physics, vol. 89, May 15, 2001, pp. 5509-5515.

Kisslinger, et al., "Bulk Heterojunction Solar Cells Based on Blends of Conjugated Polymers with II-VI and IV-VI Inorganic Semiconductor Quantum Dots", Polymers, 2017, 9, 35, 29 pages.

Transmittal of the International Search Report and Written Opinion mailed Feb. 14, 2019 from the International Search Authority—Russia—for International Application No. PCT/US18/57959, 9 pages.

Mora-Sero, Iván, "Impedance characterization of Quantum Dot Sensitized Solar Cells", Department de Fisica, Universitat Jaume I, 12071 Castelló, Spain, 2012, 12 pages.

"The metallobiology of neuromelanin pigment in the human brain studied by synchrotron X-ray microspectroscopy", European Synchrotron Radiation Facility (ESRF) Highlights, 2009, p. 107-109.

Van der Wiel et al., "Electron transport through double quantum dots", Reviews of Modern Physics, vol. 75, Jan. 2003. (Year: 2003).

Perez, et al., "Electron Tunneling in Ferritin and Associated Biosystems", (Mar. 10, 2023), TechRxiv, 11 pages.

* cited by examiner

ELECTRON TRANSPORT GATE CIRCUITS AND METHODS OF MANUFACTURE, OPERATION AND USE

RELATED APPLICATIONS

The present application is a continuation of U.S. patent application Ser. No. 16/828,384, filed Mar. 24, 2020, which claims benefit of and priority to 1) U.S. Provisional Patent Application Nos. 62/578,483, filed Oct. 29, 2017, 2) 62/581,766, filed Nov. 5, 2017, 3) 62/584,898, filed Nov. 12, 2017, 4) 62/590,632, filed Nov. 26, 2017, 5) 62/614,412, filed Jan. 6, 2018, 6) 62/641,382, filed Mar. 11, 2018, 7) is a continuation in part of PCT Patent Application No. PCT/US18/57959, filed Oct. 29, 2018, 8) claims benefit and priority to U.S. Provisional Patent application 62/823,235, filed Mar. 25, 2019, 9) U.S. Provisional Patent Application 62/852,729, filed May 24, 2019 and 10) U.S. Provisional Patent Application 62/897,542, filed Sep. 9, 2019, each of which are hereby incorporated by reference for all purposes as if set forth herein in their entireties.

TECHNICAL FIELD

The present disclosure relates generally to electric circuits, and more specifically to electron transport gated circuits that use quantum coherence or other electron transport mechanisms to actuate a gate circuit.

BACKGROUND OF THE INVENTION

Arrays of quantum dots (QDs) form electron minibands that provide electron transport through the array. See U.S. Pat. No. 9,287,412 B2, which is hereby incorporated by reference for all purposes as if set forth herein in its entirety. These quantum dots can be dispersed in bulk conjugated polymers to create a nanocomposite material with improved characteristics. See U.S. Pat. No. 9,349,888 B2, which is hereby incorporated by reference for all purposes as if set forth herein in its entirety. However, the use of such electron transport mechanisms in ensembles of devices is not known.

It is also known to use conjugated polymer nanoparticles for QD applications. See U.S. 2016/0161475 A1, which is hereby incorporated by reference for all purposes as if set forth herein in its entirety. However, formation of arrays of conjugated polymer nanoparticles with inorganic QDs is not known.

SUMMARY OF THE INVENTION

A circuit is disclosed that includes a first electrode, a second electrode and a plurality of quantum dot devices disposed between the first electrode and the second electrode. An impedance is coupled to the second electrode and has a value selected to conduct or block conduction of current when a coherent electron conduction band is formed by one or more of the quantum dot devices, such as with external quantum dot devices.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings may be to scale, but emphasis is placed upon clearly illustrating the principles of the present disclosure. Moreover, in the drawings, like reference numerals designate corresponding parts throughout the several views, and in which.

DETAILED DESCRIPTION OF THE INVENTION

Figure 1:
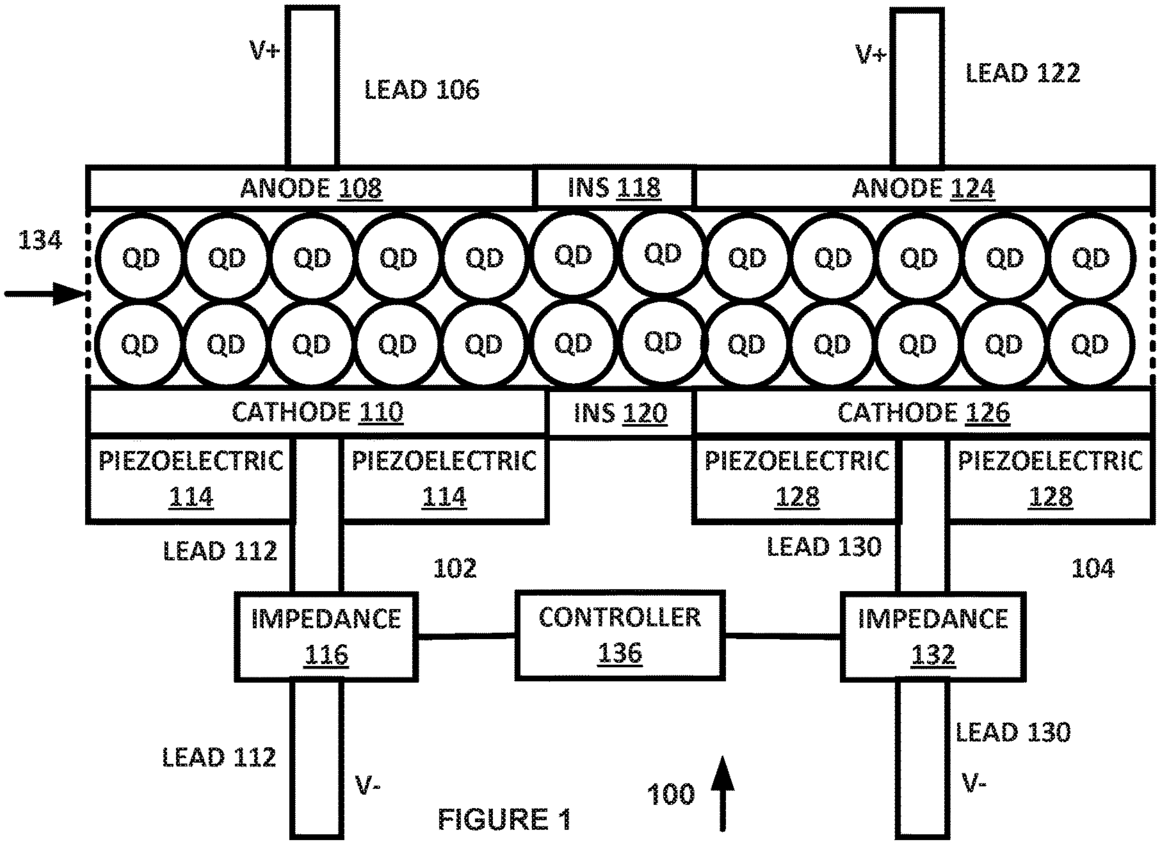
FIG. 1 is a diagram of a circuit for switching using electron transport, in accordance with an example embodiment of the present disclosure.

In the description that follows, like parts are marked throughout the specification and drawings with the same reference numerals. The drawing figures may be to scale and certain components can be shown in generalized or schematic form and identified by commercial designations in the interest of clarity and conciseness.

FIG. 1 is a diagram of a circuit 100 for switching using electron transport, in accordance with an example embodiment of the present disclosure. Circuit 100 includes electron transport device 102 and electron transport device 104, which are fabricated from quantum dots (QDs) and other components, as discussed further herein. These devices can be of similar design and are described herein as electron transport device 102/104, with associated components of each device described in a similar manner. The QDs are selected from suitable materials, and are sized and spaced to create electron transport mechanisms, such as electron minibands, electron hopping, coherent tunneling and other suitable electron transport mechanisms, as discussed above. For example, QDs can include a single layer or multiple layers of inorganic QDs, a layer of inorganic QDs on the bottom layer and a layer of organic QDs on the top layer (also referred to herein as conjugated polymer nanoparticles (CPNPs) but not limited to conjugated polymer materials), one or more layers of mixed inorganic QDs, one or more layers of mixed organic QDs, one or more layers of mixed inorganic and organic QDs, alternating layers of organic QDs and inorganic QDs, other suitable configurations of organic QDs, inorganic QDs, mixtures of organic and inorganic QDs, combinations of QDs and different materials or structures, or other suitable materials or structures that create electron transport between electron transport devices. Space 134 between QDs can be air, a conjugated polymer, ligands, a combination of these or other materials, or other suitable materials.

Electron transport devices 102/104 includes lead 106/122 to anode 108/124, and lead 112/130 to cathode 110/126. QDs or CPNPs are disposed between anode 108/124 and cathode 110/126. An impedance 116/132 is coupled in series with lead 112/130, and a piezoelectric device 114/128 can be provided to apply a force vector to the QDs and/or CPNPs of electron transport device 102/104, such as to facilitate localization of electrons or other quantum mechanical effects.

Lead 106/122, anode 108/124, lead 112/130 and cathode 110/126 can be formed by vapor deposition technology, monocrystalline wafer technology, microforming, etching or other suitable processes, using gold, aluminum, semiconductor materials, conductive oxide or other suitable materials, such as to form an electron transport device having linear conduction characteristics, Schottky conduction characteristics, diode conduction characteristics or other suitable electrical conduction characteristics. In one example embodiment, the inner surface of anode 108 and cathode 110 can be coated with patterned polymer or organic materials that are also used to form QDs that are conjugated polymer nanoparticles (CPNPs), such as poly (p-phenylene ethynylene)s (PPEs), poly (p-phenylene vinylene)s (PPVs), trioctylphosphine oxide (TOPO), poly-(3-hexylthiophene) (P3HT), polyaniline, polypyrole, materials that attract ligands such as oleic acids or other materials that are used to passivate the surface of QDs or other suitable materials, which can be patterned as needed to attract different types of QDs or CPNPs. A suitable mask can be used to coat selected portions of the inner surfaces of anode 108/124 and cathode 110/126 with suitable inorganic, polymer or organic materials, so as to facilitate arrangements of QDs and CPNPs such as those disclosed herein that improve the formation of electron minibands or other electron transport mechanisms.

Impedance 116/132 can be a fixed or variable impedance that is used to control a current flow from electron transport device 102/104. The value of impedance 116/132 can be resistive, inductive, capacitive, a suitable combination of resistive, inductive and capacitive components in series and/or parallel, a variable impedance, a controllably variable impedance or other suitable types of impedance.

Piezoelectric device 114/128 can create a force vector that causes the QDs and/or CPNPs of electron transport device 102/104, respectively, to undergo a mechanical force, such as a stress, an acceleration, a compression or other suitable forces. Piezoelectric device 114/128 can be disposed in a suitable location and orientation so as to apply or create the force vector in a predetermined orientation to an electric field vector created by the electric field components of anode 108/124 and cathode 110/126, respectively, such as an orthogonal vector orientation between the force and electric field vector or other suitable combinations of vectors.

Insulators 118 and 120 mechanically connect electron transport device 102 and electron transport device 104, and contain additional QDs and/or CPNPs. Insulators 118 and 120 and their associated QDs and/or CPNPs can be omitted, such as where sufficient coupling exists between one or more external electron transport devices and electron transport devices 102 and 104, such as where the external electron transport devices are used as a probe or sensor to interface with electron transport devices 102 and 104, and to measure a signal generated by the electron transport mechanism of electron transport devices 102 and 104. In another example embodiment, the external electron transport device can be used in vivo to interface with an array of QDs that are disposed within one or more cells, including but not limited to naturally occurring QDs such as ferritin and neuromelanin and fabricated semiconductor QDs, to modify the characteristic of the electron transport mechanism, to measure a time varying electron transport signal generated by such an array, or for other suitable purposes. In this example embodiment, the measurement of the signal generated by the electron transport mechanism can include impedance matching an effective impedance of the electron transport mechanism, use of an impedance that is selected to prevent disruption of the electron transport mechanism or other suitable circuit configurations to optimize measurement. In another example embodiment, the external electron transport devices can be placed so as to manipulate the electron transport mechanism of suitable electron transport devices in a predetermined manner, so as to modify the electron transport mechanism to increase or decrease a local effect, to increase or decrease a global effect or for other suitable purposes. The placement and electrical parameters of the external electron transport devices relative to electron transport devices 102 and 104 or other suitable electron transport devices can be determined by solution of the Kronig-Penney and Schroedinger-Poisson equations for the system.

Controller 136 can be implemented in hardware or a suitable combination of hardware and software, and can be configured to implement one or more algorithms to control the values of impedance 116 and impedance 132, such as when they are controllably variable impedances. In one example embodiment, controller 136 can be used to adjust the value of impedance 116 and impedance 132 in response to data inputs that represent physical variables, process variables or other suitable data, such as to cause the value of one of impedance 116 and impedance 132 to be lower than the other of impedance 116 and impedance 132. In this manner, controller 136 can cause electron localization and conduction in the associated electron transport device 102/104, while blocking electron localization and conduction in the other of electron transport device 102/104.

In operation, the QDs and CPNPs of circuit 100 create electron transport mechanisms through the generation of excitons, and conduct current based on the design of electron transport devices 102 and 104. In a first example embodiment, electron transport devices 102 and 104 can apply electric fields and forces that cause excitons to form in the QDs, where the excitons form electron minibands, electron hopping, coherent tunneling or other suitable electron transport mechanisms. In this example, where electron minibands are formed between the QDs of electron transport devices 102 and 104, the electrons can be made to localize in one of electron transport devices 102 or 104 by controlling the applied electric field, the applied force, the values of impedances 116 and 132 or other suitable circuit parameters of circuit 100. In this example, electrons can localize in the electron transport device 102 or 104 that has a lowest associated impedance 116 or 132, respectively, and may otherwise remain non-localized if the impedances 116 and 132 are equal and the applied electric field or the electric field and/or force vectors are not sufficient to cause localization. The specific voltage levels and forces can be determined by iteratively solving the Kronig-Penney and Schroedinger-Poisson equations for the system, such as set forth in U.S. Pat. Nos. 6,829,269, 7,026,641 and 6,627,809, each of which is hereby incorporated by reference for all purposes as if set forth herein in its entirety, as well as by determining the associated circuit parameters for the circuit based on the physical design, material properties, voltage levels and other parameters of the circuit, such set forth in U.S. Pat. Nos. 5,608,231 and 6,489,041 and U.S. Patent Application publication 2007/0162263 A1, each of which is hereby incorporated by reference for all purposes as if set forth herein in its entirety.

By selecting appropriate circuit parameters, the electron transport between electron transport devices 102 and 104 (or additional devices, as may be needed) can be used to conduct electrons through one of electron transport devices 102 and 104 (where a linear configuration is used) or to switch one of electron transport devices 102 and 104 on (where nonlinear diode/Shottky configuration is used) as a function of the value of the applied voltages, force vectors and values of impedances 116 and 132 of electron transport devices 102 and 104, respectively. For example, when the impedances are balanced and the excitation fields, force vectors and other design parameters of electron transport devices 102 and 104 are equal, then electron minibands will not localize, and other electron transport mechanisms will not transfer more electrons to any one device, which will result in low magnitude, balanced currents (for linear operation) or balanced non-linear operation. When one device output impedance is lower than the others (assuming balanced force and electric field vectors), though, the electron transport mechanisms will conduct electrons to that device, resulting in a loss of electrons in the other devices and increased current through the device with the lowest impedance (in linear operation) or an additional increase in charge carriers that can cause the device to turn on (in nonlinear operation). After the transported charge carriers have been conducted out of the device with the lowest impedance, electron transport between the devices can be re-established until another discharge cycle occurs.

Instead of varying impedances 116 and 132, the excitation vectors of electron transport devices 102 and 104 can be varied by changing the values of V+ applied to anodes 1008 and 124, where the anode with the higher applied electric field can result in localization of electrons from the electron mini-band. Likewise, force vectors or other variables can be modified. Circuit 100 can be extended from two electron transport devices 102 and 104 to a large number of electron transport devices, so long as the electron transport parameters result in suitable electron transport characteristics to support electron transport switching.

In another example embodiment, the materials of anodes 108 and 124 and cathodes 110 and 126 can be selected to create a Shottky diode, by using materials such as indium tin oxide (ITO) and aluminum, gold and aluminum or other suitable combinations, such as disclosed in U.S. Pat. No. 8,574,685 B1, which is hereby incorporated by reference for all purposes as if set forth herein in its entirety. By biasing the devices at a point where rectification current though the devices is just below where it starts to increase, electron transport between the devices can result in electrons from the electron transport mechanism being transported to the device having the lowest output impedance, which can increase the number of charge carriers and corresponding current in that device and cause it to move further into the conduction region, and conduct exponentially greater current than the other devices. Transport can be controlled by causing localization of electrons from the electron minibands or use of other electron transport mechanisms, such as by controlling the values of impedances 116 and 132, because electrons will localize in the electron transport device 102 or 104 that has the lowest impedance path to ground. The localization of electrons in one of the electron transport devices 102 or 104 drives that device into conduction mode, and thus increases the current associated with localization, which would otherwise potentially be of a lower magnitude and more difficult to detect. In this manner, the Schottky diode structure can be used to both amplify the current and to increase the sensitivity of the electron transport devices 102 and 104. Thus, to lower the sensitivity, the bias level of electron transport devices 102 and 104 can be lowered where suitable, either uniformly or separately. Likewise, a transistor configuration can be used where suitable by providing a control term and a control voltage, such as at an intermediate location between the anode and cathode or in other suitable manners.

In addition, the applied voltage levels can be selected to generate electron minibands, using materials that create excitons at the applied voltage levels. The specific voltage levels needed to generate electron minibands can be determined by solving the Schrödinger equation for the Kronig-Penney potential, as a function of the material properties and spacings selected for the quantum dots and associated materials such as conjugated polymer matrix of electron transport devices 102 and 104. Additional examples of similar materials and structures are disclosed in U.S. Patent Application publication 2007/0162263 A1, except that the semiconductor material selected for the quantum dots of the present disclosure may advantageously include an indirect bandgap instead of a direct bandgap, so as to prevent the generation of photons and corresponding loss of energy.

Figure 4:
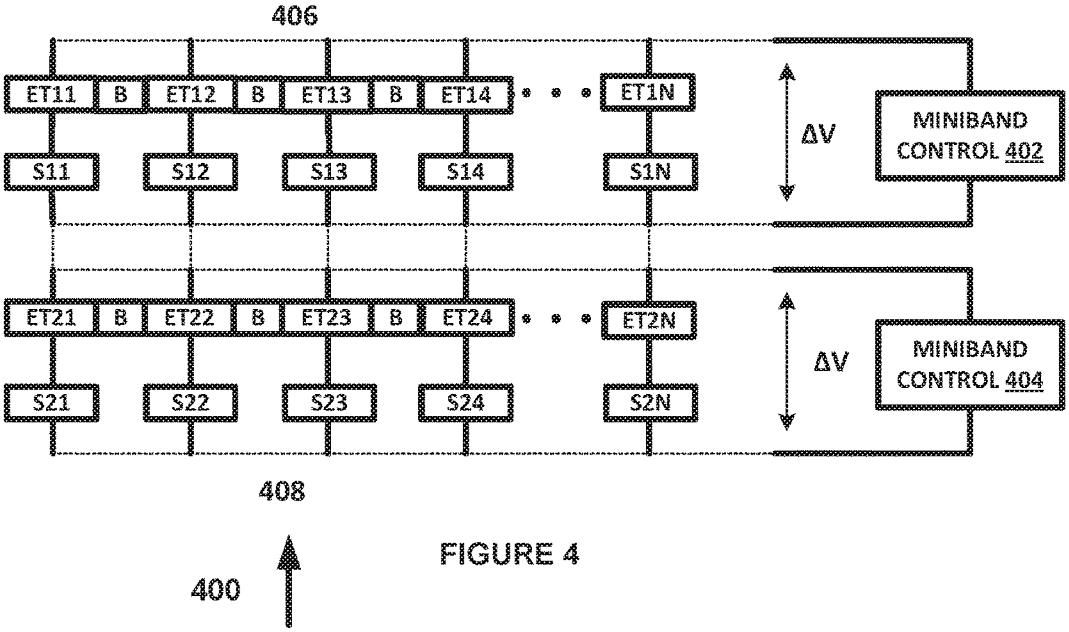
FIG. 4 is a diagram of a system for coupled electron transport devices, in accordance with an example embodiment of the present disclosure.

In addition to or instead of calculating the voltage at which electron transport will occur, a controllable voltage bias source such as that shown in FIG. 4 as miniband control 402 or 404 can be used to empirically determine the excitation levels associated with electron transport. Such control of voltage levels can be used to accommodate variations in spacing and material properties of quantum dots and components of electron transport devices 102/104.

Figure 2:
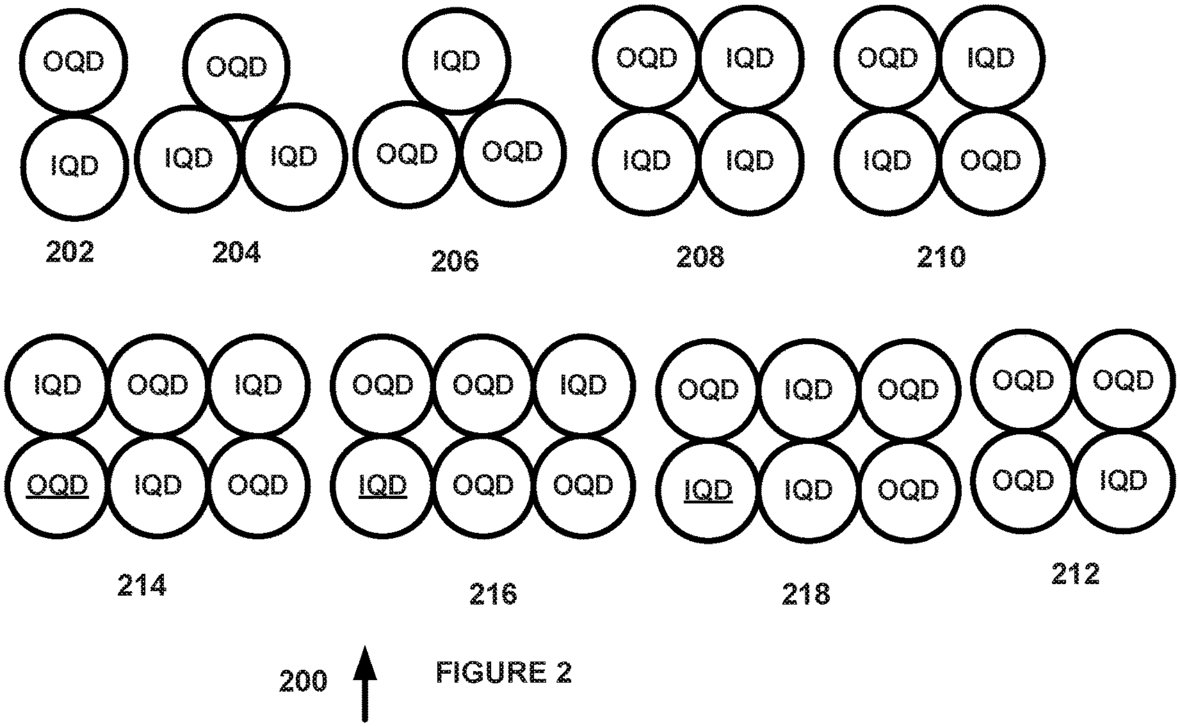
FIG. 2 is a diagram of multiple QD configurations in accordance with an example embodiment of the present disclosure.

FIG. 2 is a diagram of multiple QD/CPNP configurations 200 in accordance with an example embodiment of the present disclosure. QD configurations 202 through 218 include different combinations of QDs formed from different materials, such as neuromelanin or other polymers, ferritin or other proteins, a semiconductor (silicon, germanium, cadmium, cadmium sulfide, cadmium selenide, indium, diamond, pyrite, boron nitride, gallium arsenide, aluminum gallium arsenide, copper(I) oxide, amorphous silicon, graphene, zinc oxide, silicon carbide, gallium manganese arsenide, copper(II) chloride, gallium nitride, copper indium gallium selenide, copper(II) oxide, black silicon, uranium dioxide, mercury cadmium telluride, molybdenum, molybdenum disulfide, iron(II, III) oxide, tin dioxide, cadmium oxide, lead(II) sulfide, gallium, gallium (II) selenide, indium (III) oxide, indium antimonide, aluminum nitride, zinc sulfide, zinc telluride, aluminum phosphide, bismuth telluride, mercury telluride, zinc selenide, indium nitride, silicon-germanium, lead telluride, indium phosphide, indium gallium nitride, gallium phosphide, indium arsenide, lead(ii) iodide, indium gallium arsenide, indium(iii) sulfide, boron arsenide, lead selenide, mercury(ii) iodide, molybdenum disilicide, aluminum antimonide, tungsten disilicide, boron phosphide, indium gallium phosphide, cadmium zinc telluride, aluminum arsenide, tin telluride, silver telluride, aluminum gallium indium phosphide, cadmium arsenide, gallium antimonide, gallium indium arsenide antimonide phosphide, aluminum indium arsenide, float-zone silicon, platinum silicide, aluminum gallium nitride, gallium arsenide phosphide, beryllium telluride, mercury zinc telluride, iron phosphide, aluminum gallium phosphide, ITO or other suitable inorganic materials (all inorganic materials in porous, polycrystalline, monocrystalline, nanocrystalline or other suitable forms). In addition, organic materials such as CPNPs, PPE, PPV, TOPO, P3HT or other suitable materials can be used to form organic quantum dots (OQD) in FIG. 2, including materials used for ligand passivation layers or other suitable additional materials. While these are generally shown in QD configurations 200 as inorganic quantum dots (IQDs) and OQDs, certain multilayer QDs such as ferritin or ligand passivated QDs could be classified as either an IQD or OQD, depending on the other OQDs and IQDs used. Two or more different IQDs or OQDs can also or alternatively be used. In order to facilitate creation of electron transport, the IQDs and/or OQDs can have indirect bandgaps to prevent energy from being transformed into photons instead of causing electron transport and conduction.

The configurations 202 through 218 shown in FIG. 2 are exemplary, and other suitable arrangements and configurations of quantum dots or other exciton containment structures can also or alternatively be used to implement electron transport switching, For example, each quantum dot shown in electron transport devices 102 and 104 can be replaced by quantum dots having configurations shown in 202 through 218, such that the number of quantum dots disposed between the anodes 108/124 and cathodes 110/126 can be varied from the example embodiments shown. In addition, other materials such as solid or amorphous configurations of conjugated polymers can be used to fill the space between IQDs, combinations of OQDs and IQDs or other suitable materials.

Figure 3:
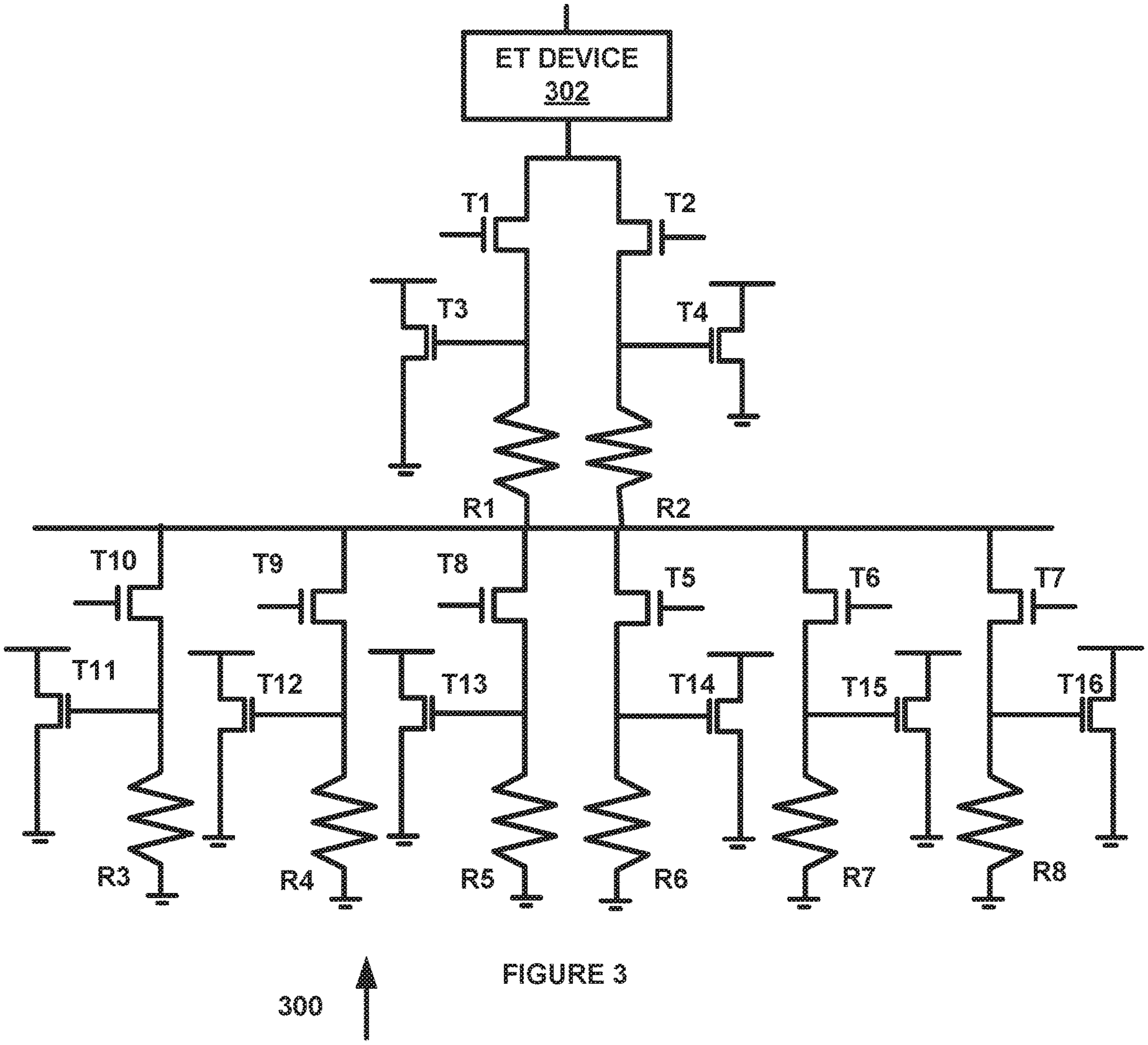
FIG. 3 is a diagram of an electron transport (ET) gate circuit with an associated impedance network, in accordance with an example embodiment of the present disclosure.

FIG. 3 is a diagram of an electron transport (ET) gate circuit 300 with an associated impedance network, in accordance with an example embodiment of the present disclosure. ET gate circuit 300 includes ET device 302, two primary gated resistances R1 and R2, which are gated by T1 and T2, and which drive the gates of T3 and T4. In series with R2 is T5 through T16, which gate R3 through R8 and which are actuated by R3 through R8 (e.g. R3 is gated by T10 and drives the gate of T11, R4 is gated by T9 and drives the gate of T9, and so forth). This circuit can be used with ET devices and associated output impedances in an array of ET devices that form an ET gate, and can be used to both select the ET device that will be actuated based on a lowest impedance, and can also generate additional indicators or actuate additional circuits by gate voltages applied to transistors T3, T4 and T11 through T16, where suitable (transistors T3, T4 and T11 through T16 and associated circuitry that may use indicators/controls can also or alternatively be omitted). Additional layers of switched impedances can also or alternatively be provided, such as to increase the selectivity of the ET gate relative to other gates. For example, if there are N ET gates, where N is an integer, then there can also be N different impedance levels possible, so as to allow a different impedance level to be assigned to each ET gate, where suitable. A similar circuit with the same or other suitable combinations of impedances, actuating gates and drivers can also or alternatively be used. For example, while resistances are shown for simplicity, other suitable combination of linear, non-linear, passive or active impedances can also or alternatively be used.

In one example embodiment, the gate voltages applied to T1, T2 and T5-T10 can be controlled by a suitable controller to adjust the impedance seem by ET device 302 as a function of external variables, such as where a similar configuration is used for a large number of ET devices that are coupled by an electron transport mechanism. In this example embodiment, the ET device that operates can be determined by a large number of parallel processes operating independently or with a complex non-linear relationship, such as a feedback controller, a neural network or other suitable control arrangements. The output of the neural network can include a plurality of digital registers that are used to select which of transistors T1, T2 and T5-T10 (or other suitable transistors of other coupled ET devices), where the actuation of one of the ET devices is used as a feedback signal to the neural network, actuates one or more external circuits or devices that generate signals that are provided as inputs to the neural network, or other suitable configurations can also or alternatively be used.

FIG. 4 is a diagram of a system 400 for coupled electron transport devices, in accordance with an example embodiment of the present disclosure. System 400 includes electron transport switches 406 and 408, which are shown connected in series by conductors. Alternatively, electron transport switches 406 and 408 can be coupled by one or more capacitive connections, one or more inductive connections, a suitable combination of capacitive, inductive and/or resistive connections or in other suitable manners. Likewise, additional electron transport devices, electron transport switches or other suitable electron transport structures can be coupled to one or both of electron transport switches 406 and 408 in such manners, where the coupling provides a modification to an input to one or more electron transport device, one or more impedance, or a combination of electron transport device inputs and associated impedances to affect operation of electron transport switches 406 and/or 408.

Electron transport switch 406 includes electron transport devices ET11 through ET1N, which are constructed similar to electron transport devices 102 or 104 or other suitable devices, and which are separated from each other by barriers B, and which have corresponding variable or fixed impedances S11 through S1N. Barriers B can be quantum dot arrays, insulators, other quantum devices or other suitable non-metallic structures that functionally separate electron transport devices ET11 through ET1N from each other. Electron transport switch 408 includes electron transport devices ET21 through ET2N, which are constructed similar to electron transport devices 102 or 104 or other suitable devices, and which are separated from each other by barriers B, and which have corresponding variable or fixed impedances S21 through S2N. Barriers B can be quantum dot arrays, insulators, other quantum devices or other suitable non-metallic structures that functionally separate electron transport devices ET21 through ET2N from each other. Miniband controls 402 and 404 are used to control the applied voltage to electron transport switches 406 and 408, respectively, to control the formation of electron minibands or other electron transport mechanisms.

In operation, the state of electron transport devices ET11 through ET1N, electron transport devices ET21 through ET2N, impedances S11 through S1N and impedances S21 through S2N determine whether electron minibands form in electron transport switches 406 and 408 and the conductive path taken by electrons in the electron minibands. Because the electrons will localize at a corresponding electron transport device that provides the lowest impedance path, the state of electrons in electron transport switches 406 and 408 is a function of the electron transport device inputs, outputs and associated impedances. The number and arrangement of electron transport devices ET11 through ET1N, electron transport devices ET21 through ET2N, and the values of impedances S11 through S1N and impedances S21 through S2N can be selected to model an analog system, such as to find an optimal routing, to solve a quantum algorithm or for other suitable purposes.

Miniband controls 402 and 404 can be implemented in hardware or a suitable combination of hardware and software, and are configured to control the applied bias voltage to electron transport switches 406 and 408, respectively. As previously discussed, by adjusting the applied bias voltage, the sensitivity of electron transport switches 406 and 408 can be increased or decreased. Miniband controls 402 and 404 can modify the bias voltage for all electron transport devices ET11 through ET1N and electron transport devices ET21 through ET2N, for individual electron transport devices ET11 through ET1N and electron transport devices ET21 through ET2N or can perform other suitable functions. In one example embodiment, a bias voltage of selected electron transport devices ET11 through ET1N and electron transport devices ET21 through ET2N can be increased, to increase the sensitivity of these electron transport devices, while the bias voltage of others of electron transport devices ET11 through ET1N and electron transport devices ET21 through ET2N can be decreased, to reduce their sensitivity. In this manner, a large input to the electron transport device that has a lower bias voltage can still cause activation of that device when the input to other electron transport devices with higher bias voltages is not sufficient to actuate those devices. The adjustment of the bias voltages can be in response to external systems settings, such as to prevent operation of safety systems in the event of low-level transients while still allowing those safety systems to operate in the event that a signal having a value that is greater than a predetermined threshold for that electron transport device is received.

Figure 5:
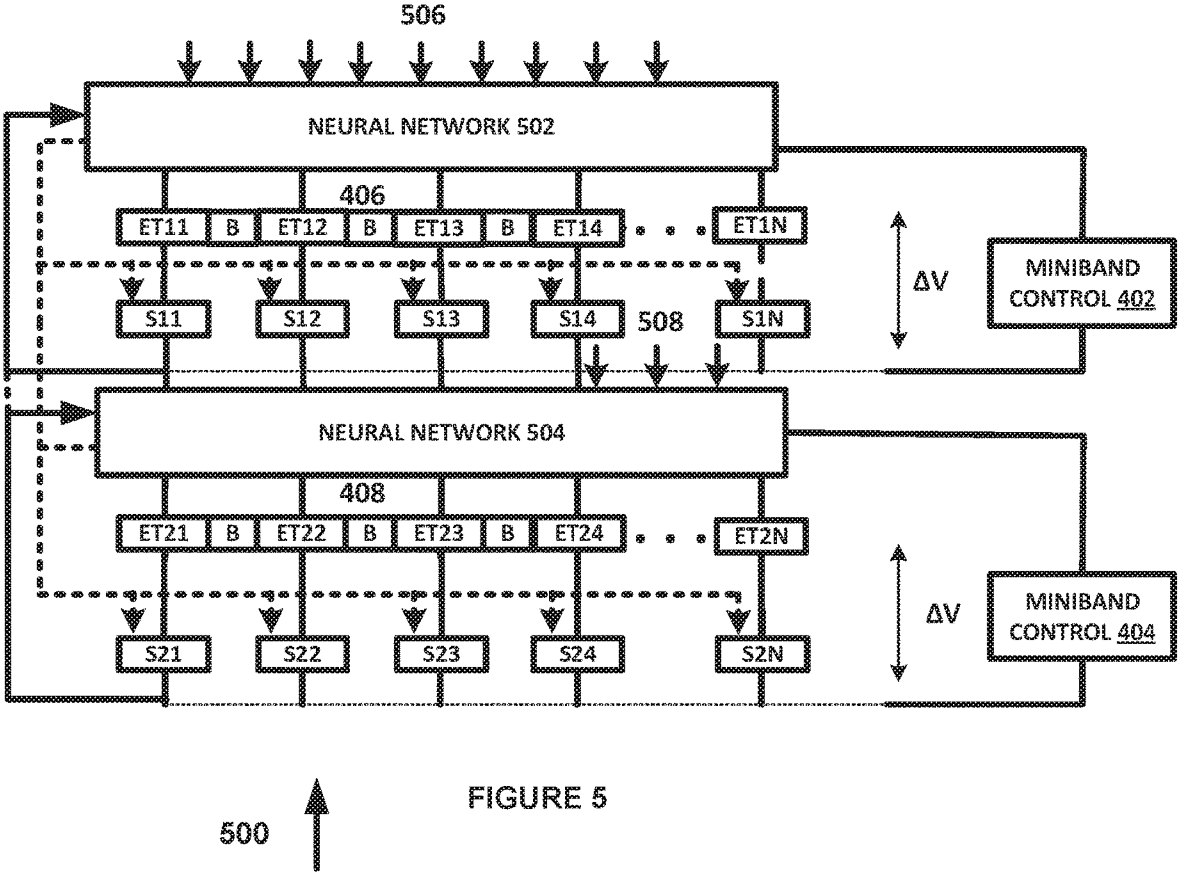
FIG. 5 is a diagram of a system for coupled electron transport devices with neural network control, in accordance with an example embodiment of the present disclosure.

FIG. 5 is a diagram of a system 500 for coupled electron transport devices with neural network control, in accordance with an example embodiment of the present disclosure. System 500 includes neural network 502, which is coupled to electron transport switch 406, and electron transport switch 408, which is connected in series to electron transport switch 406 through neural network 504. Electron transport switches 406 and 408 can also be coupled by one or more capacitive connections, one or more inductive connections, a suitable combination of capacitive, inductive and/or resistive connections or in other suitable manners. Neural networks 502 and 504 can be constructed in accordance with the disclosure of U.S. Pat. No. 9,129,221, which is hereby incorporated by reference for all purposes as if set forth herein in its entirety, or other suitable neural network architectures that can receive a plurality of different inputs, such as spiking, analog and digital inputs, and generate one or more outputs. Neural networks 502 and 504 include a plurality of nodes N1 through N1*n*, N2 through N2*n* and Nn through Nnn, arranged in a network (explicitly shown in 502), such as in stages of nodes, where each node can include data memory and can be configured to perform an associated function, and can store state data. Likewise, the nodes can have other suitable functions. The nodes can be implemented in hardware (with dedicated circuitry used for the associated memory, data storage, state and processing functionality), using a neural network parallel processor operating under programmable control of one or more algorithms or in other suitable manners.

Neural network 502 receives inputs 506, and controls the inputs to electron transport devices ET11 through ET1N, which are constructed similar to electron transport devices 102 or 104 or other suitable devices, and which are separated from each other by barriers B, and which have corresponding variable or fixed impedances S11 through S1N. Neural network 502 can also be coupled to one or more of the variable or fixed impedances S11 through S1N, and can adjust the values of one or more of the variable impedances. Barriers B can be quantum dot arrays, insulators, other quantum devices or other suitable non-metallic structures that functionally separate electron transport devices ET11 through ET1N from each other. Neural network 502 also receives one or more feedback signals from the output of electron transport switch 406 and/or 408. In one example embodiment, the feedback signals can be provided from predetermined nodes of one neural network to other nodes of the same neural network, from predetermined nodes of one neural network to nodes of a different neural network, from the output nodes of one neural network to nodes of the same or a different neural network, from the outputs of electron transport switches 406 and/or 408 to nodes of the same or a different neural network, or in other suitable manners.

Neural network 504 receives inputs 508 as well as inputs from electron transport switch 402, and controls the inputs to electron transport switch 408 including electron transport devices ET21 through ET2N, which are constructed similar to electron transport devices 102 or 104 or other suitable devices, and which are separated from each other by barriers B, and which have corresponding variable or fixed impedances S21 through S2N. Neural network 502 is coupled to one or more of the variable or fixed impedances S21 through S2N, and can adjust the values of one or more of the variable impedances. Barriers B can be quantum dot arrays, insulators, other quantum devices or other suitable non-metallic structures that functionally separate electron transport devices ET21 through ET2N from each other.

Miniband controls 402 and 404 are used to control the applied voltage to electron transport switches 406 and 408, respectively, through neural networks 502 and 504, respectively. In one example embodiment, the output nodes of neural networks 502 and 504 can include an output (e.g. digital 1 or 0) that is used to determine whether the voltage from miniband controls 402 and 404 are to be applied to a specific electron transport devoice (ET11 through ET1N or ET21 through ET2N), a multiple bit output to determine the voltage level to be applied, or to provide other suitable functions to control the formation of electron minibands or other electron transport mechanisms. Neural network 504 also receives one or more feedback signals from the output of electron transport switch 404, and can work in coordination with neural network 502 to control one or more variable impedances and electron transport device inputs.

In operation, the state of neural networks 502 and 504, electron transport devices ET11 through ET1N, electron transport devices ET21 through ET2N, impedances S11 through S1N and impedances S21 through S2N determine whether electron minibands form in electron transport switches 406 and 408 and the conductive path taken by electrons in the electron minibands. Because the electrons will localize at a corresponding electron transport device that provides the lowest impedance path, the state of electrons in electron transport switches 406 and 408 is a function of the electron transport device inputs, outputs and associated impedances.

The training of neural networks 502 and 504 and the number and arrangement of electron transport devices ET11 through ET1N, electron transport devices ET21 through ET2N, and the values of impedances S11 through S1N and impedances S21 through S2N can be selected to model an analog system, such as to find an optimal routing, to solve a quantum algorithm or for other suitable purposes. Neural networks 502 and 504 can be configured to control the voltage applied to electron transport devices ET11 through ET1N and electron transport devices ET21 through ET2N, and the values of impedances S11 through S1N and impedances S21 through S2N, such as by providing additional input switching devices to those components that are controlled by neural networks 502 and 504.

In addition, one or more outputs of switches S11 through S1N and S21 through S2N can be used to control an external system or apparatus, such as where the inputs to neural networks 502 and 504 can include optical inputs and the output or outputs are used to control movement of a robotic system by controlling a motor, where the inputs include process variable measurements and the outputs are used to control operation of processes-related equipment or other suitable devices. In this example embodiment, system 500 can be used to select a single optimal output from a plurality of different options, where each option has an associated impedance and the output with the lowest impedance is the optimal output. System 500 thus effectively allows multiple parallel paths to be modelled using neural networks 502 and 504, where neural network 504 can provides state continuity or state memory functionality relative to the outputs of neural network 504. Likewise, additional neural networks and electron transport switches can also or alternatively be provided in series or parallel with the components of system 500 for additional state control in more complex systems.

For example, in U.S. Pat. No. 6,324,532, which is hereby incorporated by reference for all purposes as if set forth herein in its entirety, a pyramid of neural networks having a "coarse to fine" processing structure is disclosed. The present disclosure can be used in conjunction with U.S. Pat. No. 6,324,532 and the feedback mechanism disclosed in U.S. Pat. No. 9,129,221 to detect objects in image data and to select a movement in response to the detected objects, where feedback can be generated that indicates whether the correct object was selected. In this example embodiment, neural network 502 can be used to generate motion control to select an object, and neural network 504 can be used to determine whether the selected object was the correct object to select based on the input criteria. Nodes 1002, 1012, 1070, 1074 and so forth of FIGS. 10, 10A and other figures of U.S. Pat. No. 9,129,221 can be used as nodes in neural networks 502 and 504, and can be coupled between neural networks 502 504 to provide feedback connections. Likewise, the feedback connections between nodes of the neural networks of FIGS. 10, 11 and 12 of U.S. Pat. No. 6,324,532 can be feedback coupled to other neural networks, such as in the manner shown by neural networks 502 and 504 of FIG. 5, or other suitable functions can also or alternatively be implemented.

In one example embodiment, the inputs 506 and 508 can represent different sensory data inputs, state data inputs, motor control data inputs and other suitable inputs, so as to effectively form a plurality of sensory circuits, state circuits, motor control circuits and other suitable circuits in conjunction with the separate nodes of neural networks 502 and 504. In addition, inputs 506 and 508 can include common inputs to neural networks 502 and 504, outputs of neural networks 502 and 504, outputs of other neural networks or other suitable inputs. In another example embodiment, mapped image data can be provided as one or more of inputs 506 and 508, and can also be provided as one or more inputs to electron transport devices ET11 through ET1N and electron transport devices ET21 through ET2N, so as to allow neural networks 502 and 504 to be trained to recognize image data of objects, where the inputs to electron transport devices ET11 through ET1N and electron transport devices ET21 through ET2N from the mapped image data reinforce the associated outputs of neural networks 502 and 504 that are associated with the identity and logical import of the object associated with the periphery image data signals. For example, if image data of a cube, a sphere and a pyramid on a surface is received and the system needs to generate a control signal to pick up one of the objects, the mapped image data signals can be processed by neural networks 502 and 504 to generate outputs associated with a cube, a sphere and a pyramid, and in conjunction with an additional input identifying the object to be picked up, the associated mapped outline can be used to activate electron transport devices ET11 through ET1N and electron transport devices ET21 through ET2N to generate an electron transport mechanism and to actuate the one of electron transport devices ET11 through ET1N and electron transport devices ET21 through ET2N associated with the motor control to pick up the corresponding object. In this regard, electron transport devices ET11 through ET1N and electron transport devices ET21 through ET2N cause the mapped image data inputs to be associated with the neural network outputs that identify the object as a cube, sphere or pyramid, the neural network outputs used to actuate a control to pick up the cube, sphere or pyramid and other suitable inputs to electron transport devices ET11 through ET1N and electron transport devices ET21 through ET2N and neural networks 502 and 504, and outputs of neural networks 502 and 504. In this regard, while a single input to electron transport devices ET11 through ET1N and electron transport devices ET21 through ET2N from neural networks 502 and 504 is shown, a node output register can be used to generate a plurality of different inputs to electron transport devices ET11 through ET1N and electron transport devices ET21 through ET2N from the output nodes of neural networks 502 and 504.

Figure 6:
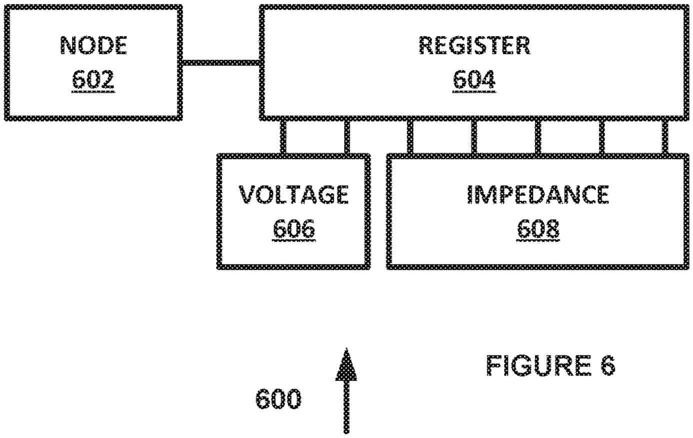
FIG. 6 is a diagram of a node output register with voltage and impedance control, in accordance with an example embodiment of the present disclosure.

FIG. 6 is a diagram 600 of a node output register 604 with voltage and impedance control, in accordance with an example embodiment of the present disclosure. Node 602 of a neural network is coupled to node output register 604, and provides a 7 bit value to node output register 604, or other suitable numbers of bits. As shown in this example embodiment, two bits are provided to voltage control 606, and five bits are provided to impedance control 608, where a suitable arrangement of transistors, logic gates or other devices can be used to generate control signals for controlling a voltage applied to an electron transport device, and impedance at the output of the electron transport device, to provide an output that can be compared to an expected value (such as during training), to provide a control output for controlling an external device, to provide an input to an electron transport switch and for other suitable purposes.

Figure 7:
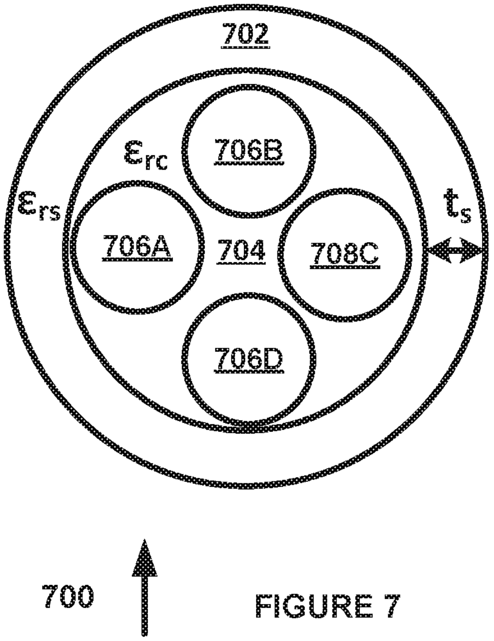
FIG. 7 is a diagram of a quantum dot, in accordance with an example embodiment of the present disclosure.

FIG. 7 is a diagram of a quantum dot 700, in accordance with an example embodiment of the present disclosure. Quantum dot 700 includes cladding 702 and core 704, and can be fabricated as discussed herein.

In one embodiment, quantum dot 700 can include a ferritin protein complex, where cladding 704 is formed from light chain ferritin and heavy chain ferritin proteins arranged in a spherical cage, and core 704 can include ferrihydrite or other suitable ionic materials. Cladding 704 typically has a thickness $t_s$ of 1-2 nm, but other suitable thicknesses can be used that provide the function of forming a Coulomb well that prevents an electron of an exciton from easily being conducted away. Likewise, cladding 704 has a relative permittivity Ers which can be greater than 1 in order to increase the Bohr radius of an exciton formed within core 704.

In the example embodiment where quantum dot 700 is a ferritin protein, the light chain ferritin proteins can conduct electrons into core 704, or electrons can alternatively tunnel into core 704, where they reduce the Fe3+ iron atoms in the ferrihydrite to Fe2+ iron atoms. Ferrihydrite has a nominal chemical formula of $5Fe_2O_3$ $9H_2O$, and the transfer of an electron into the core causes the ferrihydrite to become unstable. However, the components of ferrihydrite after the electron is received are unstable, and reform as ferrihydrite and eject the electron. In addition, the structure of ferrihydrite in the ferritin core is complex, and includes eight sub-unit core structures (of which four are shown, as sub units 706A, 706B, 706C and 706D) of ferrihydrite in a crystalline complex, surrounded by less-structured Fe3+ coordinated with $O^{2-}$ and $OH^-$, which further supports the ability of ferritin to trap electrons and to cause their energy to be reduced, increasing their de Broglie wavelength.

In an embodiment where core 704 is ferritin, the relative permittivity of the protein core Ere may also greater than 1, and may approach 80 or more, which helps to increase the Bohr radius of an exciton formed by the ferritin core material and an associated free electron. While ferritin is a convenient, naturally-occurring protein that can be used in certain embodiments, the structure of ferritin as it relates to the ability of ferritin to support electron hopping, tunneling and miniband formation could also be duplicated by suitable engineered materials, such as polymers with a high relative permittivity to form a shell or cladding, and an internal ionic material that facilitates the capture of free electrons and formation of excitons, with sub-unit structure and a surrounding ionic material that facilitates the formation of excitons.

Figure 8:
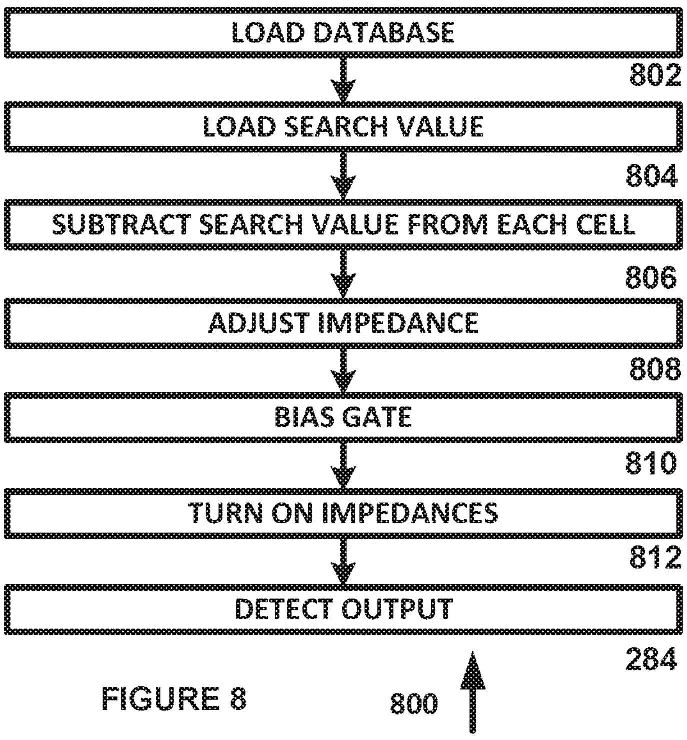
FIG. 8 is a diagram of an algorithm for searching a database using an ET circuit, in accordance with an example embodiment of the present disclosure.

FIG. 8 is a diagram of an algorithm 800 for searching a database using an ET circuit, in accordance with an example embodiment of the present disclosure. Algorithm 800 can be implemented in hardware or a suitable combination of hardware and software.

Algorithm 800 begins at 802, where a database is loaded. In one example embodiment, the database can include an array of data registers, where each data register stores a separate data cell from the database. The data registers can be in digital form, such as where a 64 bit register can be used to store a data value that has $2^{64}$ or $1.8446744\times10^{19}$ different data values. In this manner, a complex data set such as a dictionary can be converted into a smaller data set using a code book structure, such as by assigning a value of "0 . . . 00" to a first word in the dictionary, a value of "0 . . . 01" to a second word, a value of "0 . . . 10" to a third word, a value of "0 . . . 11" to a fourth word and so forth up to $1.8446744\times10^{19}$ different word or phrase values. The database values can be stored in parallel in each database register, can be stored in a combined parallel-serial operation or in other suitable manners. Likewise, other suitable database structures can also or alternatively be used. The algorithm then proceeds to 804.

At 804, a search value is loaded. In one example embodiment, the search value can be stored in a separate data register corresponding to each database cell, where the data register can be in digital form, such as where a 64 bit register can be used to store a data value that has $2^{64}$ or $1.8446744\times10^{19}$ different data values. In this manner, the complex data discussed above can be used to convert the search value to one of $1.8446744\times10^{19}$ different word or phrase values. The search value can be stored in parallel in each search register, can be stored in a combined parallel-serial operation or in other suitable manners. Likewise, other suitable database and search structures can also or alternatively be used. The algorithm then proceeds to 806.

At 806, the search value is subtracted from each database cell. In one example embodiment, the database data registers and search data registers can be subtracted using a simple binary subtraction of two registers, where each set of database cell register and subtractor register has a dedicated logic subtractor, where a shared high speed subtractor is used for a group of two or more database cells or in other suitable manners. The algorithm then proceeds to 808.

At 808, an impedance is adjusted. In one example embodiment, the output from each subtractor can be used to adjust an adjustable impedance, such as that shown in FIG. 5 or other suitable adjustable impedances. The algorithm then proceeds to 810.

At 810, an ET gate is biased. In one example embodiment, the ET gate can include a plurality of diode devices such as electron transport devices 102/104, disposed in an array and where each electron transport device is coupled to a corresponding adjustable impedance. Other suitable ET gates can also or alternatively be used. The algorithm then proceeds to 812.

At 812, impedances are turned on. In one example embodiment, a single switch or combination of switches can be used to keep an array or ET coupled devices such as diodes in a balanced state, to as to allow electron transport, coherence or other suitable states to be established in the array of ET coupled devices. Other suitable embodiments can also or alternatively be used. For example, it may be determined that the array of ET coupled devices does not require the array of associated impedances to be turned on at the same time or within a predetermined period, and it might be possible to continuously monitor the outputs of the ET coupled devices and their associated impedances to detect the ET coupled device and associated impedance that has the lowest value. The algorithm then proceeds to 814.

At 814, an output is detected. In one example embodiment, the ET coupled devices and associated impedances will only conduct electrons to ground or low potential through a single ET device, where the electrons in the array of ET devices localize in that single ET device due to the field gradient in that single ET device relative to the field gradient in the other ET devices in the array. In this example embodiment, current flow in the actuated ET coupled device can be detected by measuring a voltage drop across one or more of the impedances in the associated impedance array, or in other suitable manners.

In operation, algorithm 800 can be used in conjunction with a search circuit to perform a single step search of a large number of ET coupled devices, where the lowest impedance path can be detected using electron transport and localization of electrons in the ET coupled devices. While algorithm 800 is shown in flow chart format, an object-oriented paradigm, ladder chart or other suitable algorithmic processes can also or alternatively be used.

Figure 9:
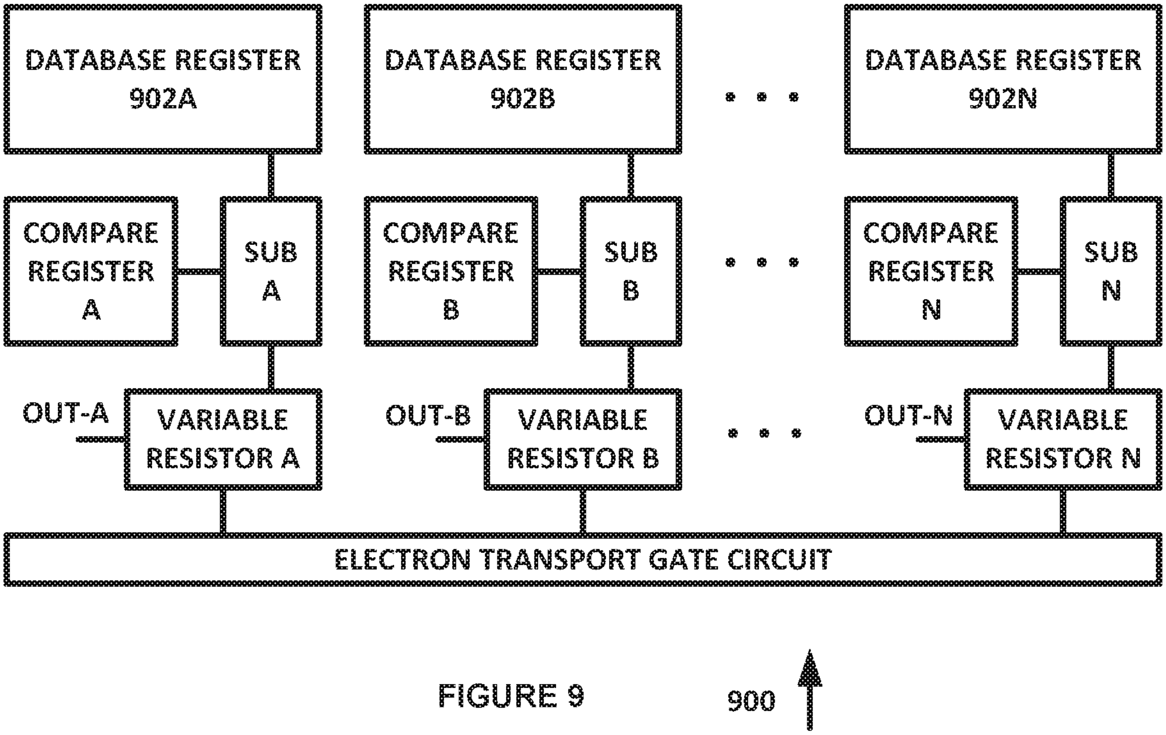
FIG. 9 is a diagram of a database search circuit with an ET gate circuit, in accordance with an example embodiment of the present disclosure.

FIG. 9 is a diagram of a database search circuit 900 with an ET gate circuit, in accordance with an example embodiment of the present disclosure. Database search circuit 900 includes database registers 902A through 902N, compare registers A through N, subtractors A through N, variable resistors A through N, outputs A through N and electron transport gate circuit, which can be implemented in suitable materials such as silicon and other materials as disclosed herein.

Database registers 902A through 902N can be implemented in silicon or other suitable materials, such as by doping the silicon to form logical data storage devices that store X bits of data in each of database registers 902A through 902N, where A is 1 and N is a suitable number of database registers and where X is a suitable value ranging from 1 to 128 or greater. Database registers 902A through 902N can be coupled to suitable data buses to allow data to be selectably read into and/or read out of individual database registers 902A through 902N, to allow voltages that are required to store data in each of database registers 902A through 902N to be refreshed, and for other suitable purposes.

Compare registers A through N can be implemented in silicon or other suitable materials, such as by doping the silicon to form logical data storage devices that store X bits of data in each of compare registers A through N, where A is 1 and N is a suitable number of database registers and where X is a suitable value ranging from 1 to 128 or greater. Compare registers A through N can be coupled to suitable data buses to allow data to be selectably read into and/or read out of individual compare registers A through N, to allow voltages that are required to store data in each of compare registers A through N to be refreshed, and for other suitable purposes.

Subtractors A through N are coupled to a corresponding one of database registers 902A through 902N and compare registers A through N, and are configured to subtract the value stored in the corresponding one of compare registers A through N from the corresponding one of database registers 902A through 902N. For example, subtractor A subtracts the value stored in compare register A from the value in database register 902A, subtractor B subtracts the value stored in compare register B from the value in database register 902B, subtractor C subtracts the value stored in compare register C from the value in database register 902C and so forth for each of the A through N cells, where each cell is formed by one of the subtractors, a corresponding one of the compare registers and a corresponding one of the database registers.

Figure 11:
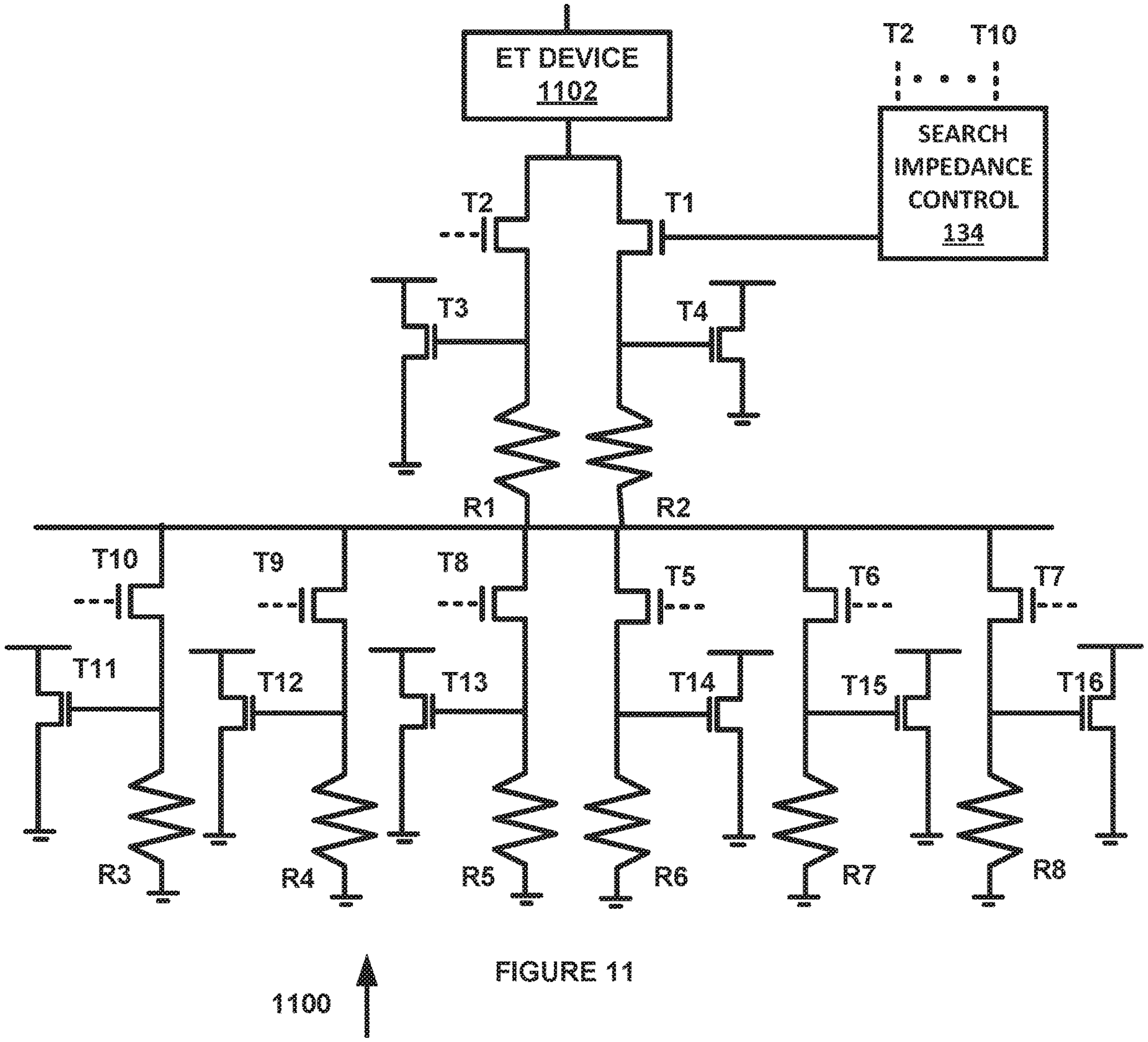
FIG. 11 is a diagram of an ET gate circuit with an associated impedance network, in accordance with an example embodiment of the present disclosure.

Variable resistors A through N each receive an output from a corresponding one of subtractors A through N and use the value to configure a resistance value of the variable resistor. In one example, embodiment, the value of variable resistors A though N can have a desired level of precision, such as to allow a closest match to be determined. In this embodiment, database search circuit 900 can be used to find a closest match even when an exact match is not found, to a desired level of precision. Referring to FIG. 11, by providing a suitable number of levels of impedance and combinations of impedances, the odds of a collision (such as where a number of database entries result in the same lowest impedance value) can be reduced. In that configuration, the output from database search circuit 900 might be blocked by persistent non-localization of electrons, although it is also possible that one or more outputs could be generated, depending on the specific design of database search circuit 900. In order to avoid such configurations, an alternate embodiment would be to use database search circuit 900 only to identify exact matches, where anything other than an exact match results in a maximum resistance, and where an exact match results in a lowest resistance.

Outputs A through N are used to monitor the cell having the lowest impedance. Unlike a configuration of database search circuit 900 that does not include an electron transport gate circuit, only a single one of outputs A through N will generate a non-zero value, which enables that output to be detected using a grid detection technique or in other suitable manners.

Electron transport gate circuit is configured in accordance with the principles discussed in regards to circuit 100 or in other suitable manners, and allows database search circuit 900 to operate without requiring excessive levels of current or excessive values of resistance. For example, in an embodiment where an array of cells that is $10^9$ in size is used, individual resistances of even $10^9$ ohms would still result in amperes of current at operational voltages in the range of 1 to 3 volts, plus the size of a resistor having a value of $10^9$ ohms would be prohibitively large. As such, electron transport gate circuit allows database search circuit 300 to be implemented in a very large scale integrated circuit (VLSI) without excessive space or power requirements.

Figure 10:
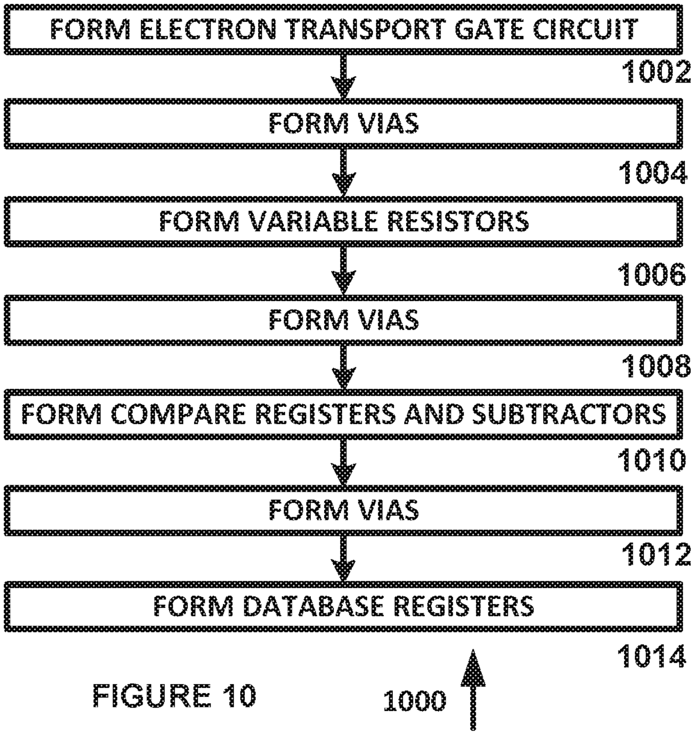
FIG. 10 is a diagram of an algorithm for controlling manufacture of a database search circuit with an ET gate circuit, in accordance with an example embodiment of the present disclosure.

FIG. 10 is a diagram of an algorithm 1000 for controlling manufacture of a database search circuit with an ET gate circuit, in accordance with an example embodiment of the present disclosure. Algorithm 1000 can be implemented in hardware or a suitable combination of hardware and software, such as process controller for an integrated circuit manufacturing process.

Algorithm 1000 begins at 1002, where an electron transport gate circuit is formed. In one example, embodiment, the electron transport gate circuit can be formed by etching, lithography, ion beams, deposition, metallization, doping, annealing or in other suitable manners. In addition, placement of quantum dots within the electron transport gate structure can be performed using polymerization, ligand exchange, electrostatics, oxidation, physical vapor deposition, atomic-layer deposition and other suitable processes. The algorithm then proceeds to 1004.

At 1004, conducting vias are formed. In one example embodiment, the conducting vias can be formed by etching, lithography, ion beams, deposition, metallization, doping, annealing or in other suitable manners. The algorithm then proceeds to 1006.

At 1006, variable resistors are formed. In one example embodiment, the variable resistors can be formed by configuring a plurality of resistors and switches in a suitable configuration, such as disclosed herein, using etching, lithography, ion beams, deposition, metallization, doping, annealing or in other suitable manners. The algorithm then proceeds to 1008.

At 1008, conducting vias are formed. In one example embodiment, the conducting vias can be formed by etching, lithography, ion beams, deposition, metallization, doping, annealing or in other suitable manners. The algorithm then proceeds to 1010.

At 1010, compare registers and subtractors are formed. In one example embodiment, the compare registers and subtractors can be formed by configuring a plurality of switches and logic devices as disclosed herein, using etching, lithography, ion beams, deposition, metallization, doping, annealing or in other suitable manners. The algorithm then proceeds to 1012.

At 1012, conducting vias are formed. In one example embodiment, the conducting vias can be formed by etching, lithography, ion beams, deposition, metallization, doping, annealing or in other suitable manners. The algorithm then proceeds to 1014.

At 1014, database registers are formed. In one example embodiment, the database registers can be formed can be formed by configuring a plurality of switches and logic devices as disclosed herein, using etching, lithography, ion beams, deposition, metallization, doping, annealing or in other suitable manners.

In operation, algorithm 1000 can be used to manufacture a search circuit that uses a lowest resistance path quantum search to identify the closest matching cell in an array of database cells. While algorithm 1000 is shown in flow chart format, an object-oriented paradigm, ladder chart or other suitable algorithmic processes can also or alternatively be used.

FIG. 11 is a diagram of an ET gate circuit 1100 with an associated impedance network, in accordance with an example embodiment of the present disclosure. ET gate circuit 1100 includes ET device 1102, two primary gated resistances R1 and R2, which are gated by T1 and T2, and which drive the gates of T3 and T4. In series with R2 is T5 through T16, which gate R3 through R8 and which are actuated by R3 through R8 (e.g. R3 is gated by T10 and drives the gate of T11, R4 is gated by T9 and drives the gate of T9, and so forth). This circuit can be used with ET devices and associated output impedances in an array of ET devices that form an ET gate, and can be used to both select the ET device that will be actuated based on a lowest impedance, and can also generate additional indicators or actuate additional circuits by gate voltages applied to transistors T3, T4 and T11 through T16, where suitable (transistors T3, T4 and T11 through T16 can be coupled to circuitry for generating an indication that current is flowing through the associated gate resistance, and associated circuitry that may use indicators/controls can also or alternatively be used or omitted). Additional layers of switched impedances can also or alternatively be provided, such as to increase the selectivity of the ET gate relative to other gates. For example, if there are N ET gates, where N is an integer, then there can also be up to N different impedance levels possible, so as to allow a different impedance level to be assigned to each ET gate, where suitable. A similar circuit with the same or other suitable combinations of impedances, actuating gates and drivers can also or alternatively be used. For example, while resistances are shown for simplicity, other suitable combination of linear, non-linear, passive or active impedances can also or alternatively be used.

In one example embodiment, the gate voltages applied to T1, T2 and T5-T10 can be controlled by a suitable controller to adjust the impedance seem by ET device 1102 as a function of external variables, such as where a similar configuration is used for a large number of ET devices that are coupled by an electron transport mechanism. In this example embodiment, the ET device that operates can be determined by a large number of parallel processes operating independently or with a complex non-linear relationship, such as a search circuit that determines a closeness of matching between a search value and a database value or other suitable configurations can also or alternatively be used.

Figure 12:
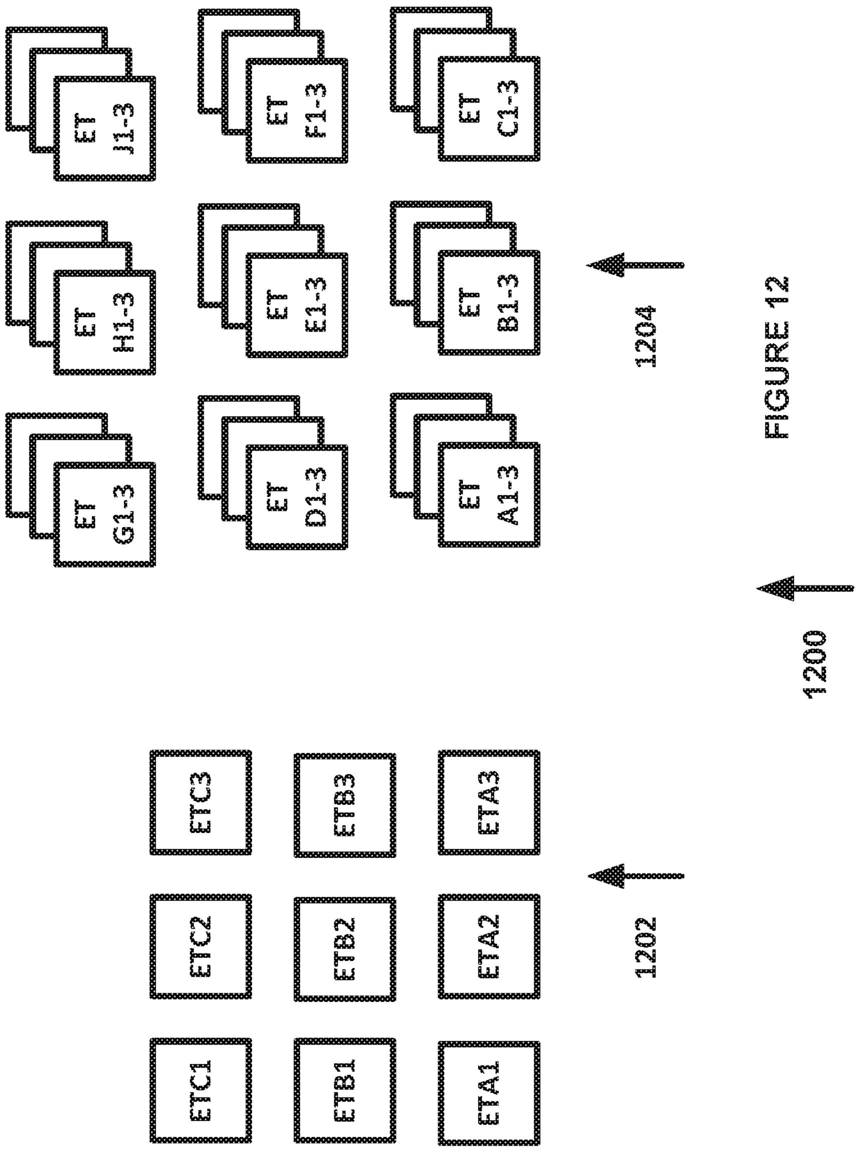
FIG. 12 is a diagram of a two-dimensional state machine and a three-dimensional state machine, in accordance with an example embodiment of the present disclosure.

FIG. 12 is a diagram 1200 of a two-dimensional state machine 1202 and a three-dimensional state machine 1204, in accordance with an example embodiment of the present disclosure. Two-dimensional state machine 1202 can include a plurality of electron transport devices ETA1, ETA2, ETA3, ETB1, ETB2, ETB3, ETC1, ETC2 and ETC3 (the 2D array devices), each of which can include associated variable impedances, positive and negative terminals and associated structural elements as shown for electron transport device 102 and electron transport device 104, or other electron transport devices as shown and described herein. In addition, each of the 2D array devices can be separated from each other by insulators and QDs, such as shown in FIG. 1, to allow electron transport to occur between each of the 2D array devices.

Three-dimensional state machine 1204 can include a plurality of electron transport devices ETA1-3, ETB1-3, ETC1-3, ETD1-3, ETE1-3, ETF1-3, ETG1-3, ETH1-3 and ETJ1-3 (the 3D array devices), each of which can include associated variable impedances, positive and negative terminals and associated structural elements as shown for electron transport device 102 and electron transport device 104, or other electron transport devices as shown and described herein. In addition, each of the 3D array devices can be separated from each other by insulators and QDs, such as shown in FIG. 1, to allow electron transport to occur between each of the 3D array devices.

In operation, the electron transport mechanisms between each of the 2D array devices and the 3D array devices will be a function of the activation level of each of the individual devices in the arrays. This is also applicable to the one dimensional arrays disclosed herein, where the coupling between those electron transport devices can occur through an inactive electron transport device. While the level of activation can be understood as depending on the voltage levels applied to the terminals and the associated exciton generation, a digital representation of the state of each device as either "active" or "inactive" can be used to understand the operation of each of the 2D array device and 3D array device as a state machine with $2^N$ states (and with greater than $2^N$ states for trinary, quaternary or greater levels), where N represents the number of active devices. The actual number of states will also be a function of the impedances associated with each electron transport device, the voltage level/exciton generation level of each device and other system variables, and the number of electrons that localize at a lowest impedance device will be determined by the dynamic behavior of those variables. For example, in a 3D array where electron transport devices A1 and J3 are the only active devices, and where device A1 has the lowest impedance, the number of electrons that can be transported to device A1 (if any) will be much lower than when each of the devices in the 3D array are active. Electrons can localize at the lowest impedance device that is active, or that is part of an active array. Thus, in a 3D array where devices A1 and A2 are active but device J3 has the lowest impedance, device J3 might be unable to localize electrons, but in a 3D array where devices A1 and A3 are active and device A2 has the lowest impedance, device A2 may be able to localize electrons, depending on the electron transport characteristics of the active array (e.g., whether electron minibands are formed, if electron transport is driven by tunneling or hopping, or based on other factors that result from a specific design configuration).

In operation, two-dimensional state machine 1202 and a three-dimensional state machine 1204 can be used to increase the number of states that can be represented by a predetermined number of electron transport devices. By increasing the number of dimensions from one to two or three, and with adequate coupling and excitation level control, the number of states that are represented can be increased to result in a substantial increase in information storage density.

A controller coupled to the electron transport devices (such as controller 136) can be used to implement a state diagram, as a function of the states that are active with device excitation levels. For example, in two-dimensional state machine 1202, activating devices ETA1 and ETA3 could also enable device ETA2 to be used to store state data, such as where the inputs would be a high impedance setting for devices ETA1 and ETA3 and a low impedance setting for device ETA2, and where the input is 1 0 1 the output would be 0 1 0. If devices ETA1 and ETA2 are activated and device ETA3 is in activate, then the input would be 1 1 and the output would be 0 1 for the same impedance settings. In this manner, the number of available outputs as a function of the number of activated devices can be greater than $2^2$ when there are only 2 devices active, depending on the device design and the impedance value setting (for digital data storage). For example, two-dimensional state machine 1202 could be implemented so that activation of any two devices allow the lowest impedance path through any of the inactive devices to conduct current to ground, which would allow a 2 bit input to two devices to have nine associated output states, or a two bit input to any two devices to have 9 associated output states. Alternatively, two-dimensional state machine 1202 could be implemented so that only predetermined input states can cause current to flow through a lowest impedance of a predetermined device. For example, two-dimensional state machine 1202 could be implemented so that activation of devices ETA1 and ETC3 can allow current to flow in a lowest impedance in any device except ETC1 and ETA3, such that lowest impedance paths in ETC1 and ETA3 do not result in an output when ETA1 and ETC3 are inputs, but do result in an output when ETC1 and ETA3 are inputs. As such, a truth table can be constructed that has more than $2^9$=512 output states, as a function of the implementation of two-dimensional state machine 1202, where inputs are active devices, and impedance settings and device configurations are used to determine the permitted output states.

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes one or more microcomputers or other suitable data processing units, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one example embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections. The term "data" can refer to a suitable structure for using, conveying or storing data, such as a data field, a data buffer, a data message having the data value and sender/receiver address data, a control message having the data value and one or more operators that cause the receiving system or component to perform a function using the data, or other suitable hardware or software components for the electronic processing of data.

All documents cited herein are for the purposes of enablement only unless otherwise stated, and are incorporated by reference as if set forth in their entirety in addition to any references cited in those documents, for the purposes of enablement. The analysis set forth herein is not intended to be an explanation of the complex neural processes that occur in biological organisms, but is instead directed to potentially useful mechanisms that could be used to help to model those complex neural processes or to allow a prosthetic neural device or other neural interface to be used to interact with those complex neural processes. Likewise, the quantum mechanical effects such as the formation of electron minibands, entanglement, coherence, tunneling and so forth as based on potential mechanisms that could be present in the SN and LC neurons, but to the extent that a different quantum mechanical effect is responsible for the transfer of energy between QS gates using the same disclosed structures and materials, the present disclosure is intended to encompass such effects.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A nanoparticle, comprising:

an inorganic core that includes a plurality of discrete sub-units formed from a first material disposed in a second material; and an organic shell fabricated around the inorganic core.

2. The nanoparticle of claim 1 wherein the organic shell is a cladding.

3. The nanoparticle of claim 1 wherein the organic shell has a thickness ranging from 1 nanometer to 2 nanometers.

4. The nanoparticle of claim 1, wherein the organic shell is formed from a protein.

5. The nanoparticle of claim 1, wherein the inorganic core is formed from a metal oxide.

6. The nanoparticle of claim 1, wherein the organic shell has a relative permittivity of greater than one.

7. The nanoparticle of claim 1, wherein the organic shell is formed from protein subunits.

8. The nanoparticle of claim 1, wherein the inorganic core comprises a crystalline complex.

9. The nanoparticle of claim 1, wherein the organic shell is formed from a polymer.

10. The nanoparticle of claim 1, wherein the organic shell is formed from protein subunits.

11. The nanoparticle of claim 1, wherein the discrete sub-units of the inorganic core comprises a crystalline hydrate compound and the second material comprises an ionic material.

12. A nanoparticle assembly, comprising:

a first nanoparticle comprising:

an inorganic core that includes a plurality of sub-units; and an organic shell disposed around the inorganic core;

a second nanoparticle disposed at a predetermined location adjacent to the first nanoparticle; and wherein the first nanoparticle and the second nanoparticle are disposed between two first electrodes to form a first device.

13. The nanoparticle assembly of claim 12 wherein the second nanoparticle is formed from a pi-conjugated polymer.

14. The nanoparticle assembly of claim 12 wherein the organic shell is cladding.

15. The nanoparticle assembly of claim 12 wherein the organic shell has a thickness ranging from 1 nanometer to 2 nanometers and the first nanoparticle and the second nanoparticle are configured to allow electrons to tunnel between the two first electrodes.

16. The nanoparticle assembly of claim 12, further comprising a second device having two second electrodes and a plurality of nanoparticles disposed between the two second electrodes in electrical communication with the first nanoparticle and the second nanoparticle.

17. The nanoparticle assembly of claim 12, further comprising a second device having two second electrodes and a plurality of nanoparticles disposed between the two second electrodes in electrical communication with the first nanoparticle and the second nanoparticle through a plurality of intervening nanoparticles.

18. The nanoparticle assembly of claim 12, further comprising a second device having two second electrodes and a plurality of nanoparticles disposed between the two second electrodes in electrical communication with the first nanoparticle and the second nanoparticle through a plurality of intervening nanoparticles, wherein an impedance to ground coupled to one of the first two electrodes causes electrons to tunnel between the first device and the second device when a voltage is applied to one or more of the first device and the second device.

19. The nanoparticle assembly of claim 12, further comprising a second device having two second electrodes and a plurality of nanoparticles disposed between the two second electrodes in electrical communication with the first nanoparticle and the second nanoparticle through a plurality of intervening nanoparticles, wherein a difference between a first impedance to ground coupled to one of the first two electrodes and a second impedance to ground coupled to one of the second electrodes causes electrons to tunnel between the first device and the second device when a voltage is applied to one or more of the first device and the second device.

20. A nanoparticle assembly, comprising:

a first nanoparticle comprising:

an inorganic core that includes a plurality of sub-units; and an organic shell fabricated around the inorganic core; and an organic nanoparticle disposed at a predetermined location adjacent to the first nanoparticle.

* * * * *